United States Patent
Tosa et al.

(10) Patent No.: US 11,013,068 B2
(45) Date of Patent: May 18, 2021

(54) MULTILAYER HEATING BODY

(71) Applicant: NGK SPARK PLUG CO., LTD., Nagoya (JP)

(72) Inventors: Akifumi Tosa, Komaki (JP); Yasuhiko Inui, Kani (JP); Kaname Miwa, Komaki (JP); Yosuke Shinozaki, Tajimi (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 695 days.

(21) Appl. No.: 15/177,927

(22) Filed: Jun. 9, 2016

(65) Prior Publication Data

US 2017/0359859 A1 Dec. 14, 2017

(51) Int. Cl.
| | |
|---|---|
| *H05B 3/26* | (2006.01) |
| *H01L 21/67* | (2006.01) |
| *H05B 1/02* | (2006.01) |
| *H01L 21/683* | (2006.01) |

(52) U.S. Cl.
CPC ......... *H05B 3/26* (2013.01); *H01L 21/67103* (2013.01); *H01L 21/6831* (2013.01); *H05B 1/0233* (2013.01)

(58) Field of Classification Search
CPC ................................. H05B 3/26; H05B 1/0233
USPC ........ 219/205, 477, 478, 480; 392/433, 416, 392/404; 338/310, 311, 312, 313
See application file for complete search history.

(56) References Cited

U.S. PATENT DOCUMENTS

| | | |
|---|---|---|
| 2013/0015711 A1 | 1/2013 | Lacey |
| 2013/0157115 A1 | 6/2013 | Kobayashi et al. |
| 2016/0205726 A1* | 7/2016 | Spielmann ............... H05B 3/12 219/543 |

FOREIGN PATENT DOCUMENTS

| | | | | |
|---|---|---|---|---|
| JP | 2002-12195 | * | 1/2001 | ............... B23Q 3/15 |
| JP | 2014-075525 | * | 4/2014 | ........... H01L 21/683 |
| JP | 2014-75525 A | | 4/2014 | |
| JP | 2015-191837 A | | 11/2015 | |

(Continued)

OTHER PUBLICATIONS

Machine Translation of JP2000021961, Dec. 2018.*

(Continued)

*Primary Examiner* — Tu B Hoang
*Assistant Examiner* — Thomas J Ward
(74) *Attorney, Agent, or Firm* — Stites & Harbison, PLLC; Jeffrey A. Haeberlin; James R. Hayne

(57) ABSTRACT

A multilayer heating body (1) includes a ceramic substrate (3), an electrode (4), heaters (5, 7), terminals (11, 13, 15, 17), and an electricity supply path (19). Through vias which constitute the electricity supply path include at least one combination of through vias α, β, γ, and δ which meets the following conditions (1) and (2). Condition (1): when the ceramic substrate is viewed from the front surface (3a) side toward the back surface (3b) side, the through via δ is located at a position where the through via δ overlaps the through via β, or in the vicinity of the through via β. Condition (2): when the ceramic substrate is viewed from the front surface side toward the back surface side, the through via γ is located at a position between the through via α and the through via δ, or located at a position where the through via γ overlaps the through via α, or in the vicinity of the through via α.

6 Claims, 9 Drawing Sheets

(56) References Cited

FOREIGN PATENT DOCUMENTS

WO   2012/029235 A1   3/2012

OTHER PUBLICATIONS

Machine Translation of JP 2014-075525; Translated Apr. 2014.*
Japan Patent Office, Office Action (Notification of Reasons for Refusal) issued in corresponding Application No. 2015-013341, dated Oct. 23, 2018.
Korean Intellectual Property Office, Office Action (Notification of Reason for Refusal) issued in corresponding Application No. 10-2016-0070948, dated Sep. 11, 2019.

* cited by examiner

MULTILAYER HEATING BODY

TECHNICAL FIELD

The present invention relates to a multilayer heating body.

BACKGROUND ART

Conventionally, for example, in a semiconductor manufacturing apparatus, an electrostatic chuck is used for fixing a semiconductor wafer (e.g., a silicon wafer) in dry etching or like processing, for fixedly chucking a semiconductor wafer to correct warpage, for chucking a semiconductor wafer for transportation, etc.

In the case of using the electrostatic chuck in a dry etching apparatus of the semiconductor fabrication system, if the temperature of a semiconductor wafer fixed to the electrostatic chuck varies from position to position, etching accuracy deteriorates. Thus, in order to enhance accuracy in processing on the semiconductor wafer, the temperature of the semiconductor wafer must be rendered uniform. Thus, the electrostatic chuck includes an internal heater for uniformly heating the semiconductor wafer.

The electrostatic chuck having a built-in heater includes an electricity supply path for supplying electricity to the heater from a terminal attached to one end of the electrostatic chuck on the back surface side thereof. The electricity supply path has a structure in which a plurality of conductive layers and a plurality of through vias are alternately stacked. A conductive layer adjacent to the heater and partially constituting the electricity supply path generates a large amount of heat. The generation of heat by the conductive layer causes the surface temperature of the electrostatic chuck to become nonuniform; as a result, the temperature of a semiconductor wafer becomes nonuniform.

In order to cope with the above problem, there has been proposed a method in which the electricity supply path is divided into a plurality of layers in the vicinity of the conductive layer adjacent to the heater to thereby reduce current density in the layers, whereby the generation of heat is restrained (see Patent Document 1).

PRIOR ART DOCUMENT

Patent Document

[Patent Document 1] Japanese Patent Application Laid-Open (kokai) No. 2014-75525

SUMMARY OF THE INVENTION

Problem to be Solved by the Invention

In some cases, the technique described in Patent Document 1 has failed to sufficiently restrain the generation of heat in an electricity supply path. The present invention has been conceived in view of the foregoing, and an object of the invention is to provide a multilayer heating body capable of solving the above problem.

Means for Solving the Problem

A multilayer heating body of the present invention comprises a ceramic substrate having a front surface and a back surface and adapted to support an object of processing on the front surface, an electrode provided in the ceramic substrate and adapted to chuck the object of processing, a heater provided in the ceramic substrate and adapted to heat the object of processing, a terminal attached to one end of the ceramic substrate on the back surface side, and an electricity supply path for supplying electricity from the terminal to the heater. The electricity supply path is formed by combining a plurality of conductive layers and a plurality of through vias provided in the ceramic substrate. The plurality of through vias include a through via $\alpha$, a through via $\beta$, a through via $\gamma$, and a through via $\delta$ which are defined below. There exists at least one combination of the through via $\alpha$, the through via $\beta$, the through via $\gamma$, and the through via $\delta$ which meets conditions (1) and (2) specified below.

Through via $\alpha$: a through via which connects the heater and a conductive layer X, which is one of the conductive layers.

Through vias $\beta$ and $\gamma$: through vias which connect a conductive layer Y, which is one of the conductive layers, and the conductive layer X.

Through via $\delta$: a through via which connects a conductive layer Z, which is one of the conductive layers, or the terminal and the conductive layer Y.

Condition (1): when the ceramic substrate is viewed from the front surface side toward the back surface side, the through via $\delta$ is located at a position where the through via $\delta$ overlaps the through via $\beta$, or in the vicinity of the through via $\beta$.

Condition (2): when the ceramic substrate is viewed from the front surface side toward the back surface side, the through via $\gamma$ is located at a position between the through via $\alpha$ and the through via $\delta$, or located at a position where the through via $\gamma$ overlaps the through via $\alpha$, or in the vicinity of the through via $\alpha$.

In the multilayer heating body of the present invention, the positional relation between the through vias $\beta$ and $\delta$ in the at least one combination meets the condition (1). Thus, the resistance of a path from the through via $\delta$ to the through via $\beta$ in the conductive layer Y becomes low. Accordingly, the generation of heat in the conductive layer Y can be restrained.

Also, in the multilayer heating body of the present invention, the electricity supply path includes a path extending through the through via $\beta$ and a path extending through the through via $\gamma$ which are in parallel with each other. Further, since the positional relation among the through vias $\alpha$, $\gamma$, and $\delta$ in the at least one combination meets the condition (2), current flows sufficiently not only in the path extending through the through via $\beta$ but also in the path extending through the through via $\gamma$. As a result, current which flows in the path extending through the through via $\beta$ is restrained, whereby the generation of heat in the path can be restrained.

MODES FOR CARRYING OUT THE INVENTION

Figure 1:
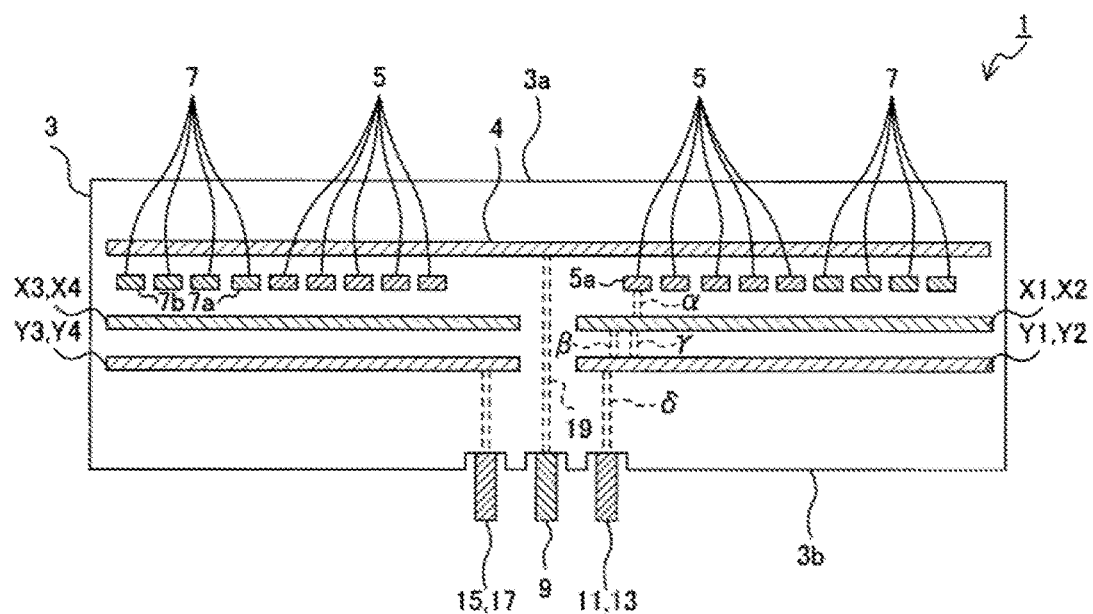
FIG. 1 Sectional side view showing the structure of an electrostatic chuck 1.

Embodiments of the present invention will be described.

First Embodiment

1. Structure of Electrostatic Chuck 1

The structure of an electrostatic chuck 1, which is an embodiment of a multilayer heating body, will be described with reference to FIGS. 1 to 4. The electrostatic chuck 1 includes a disk-like ceramic substrate 3 and members provided inside the ceramic substrate 3; namely, a chucking electrode 4, an inner heater 5, an outer heater 7, and conductive layers X1, X2, X3, X4, Y1, Y2, Y3, and Y4. The electrostatic chuck 1 also includes terminals 9, 11, 13, 15, 17.

The ceramic substrate 3 is a disk-like member formed by laminating layers (green sheets) formed of ceramic and organic components, and firing the laminate. The ceramic substrate 3 has a front surface 3a and a back surface 3b. The front surface 3a chucks and supports a semiconductor wafer (e.g., a silicon wafer), which is an object of processing. Hereinafter, a direction directed from the front surface 3a toward the back surface 3b is called a thickness direction. A front surface 3a side is called an upper side, and a back surface 3b side is called a lower side. The green sheets used to form the ceramic substrate 3 are laminated in the thickness direction.

The chucking electrode 4 is a metallization layer formed of W, Mo, Pt, or the like. The chucking electrode 4 is provided in the ceramic substrate 3 in parallel with the front surface 3a at a position located toward the front surface 3a. The chucking electrode 4 is connected to a terminal 9 by an electricity supply path 19. The chucking electrode 4 is for chucking the object of processing on the front surface 3a.

Figure 2:
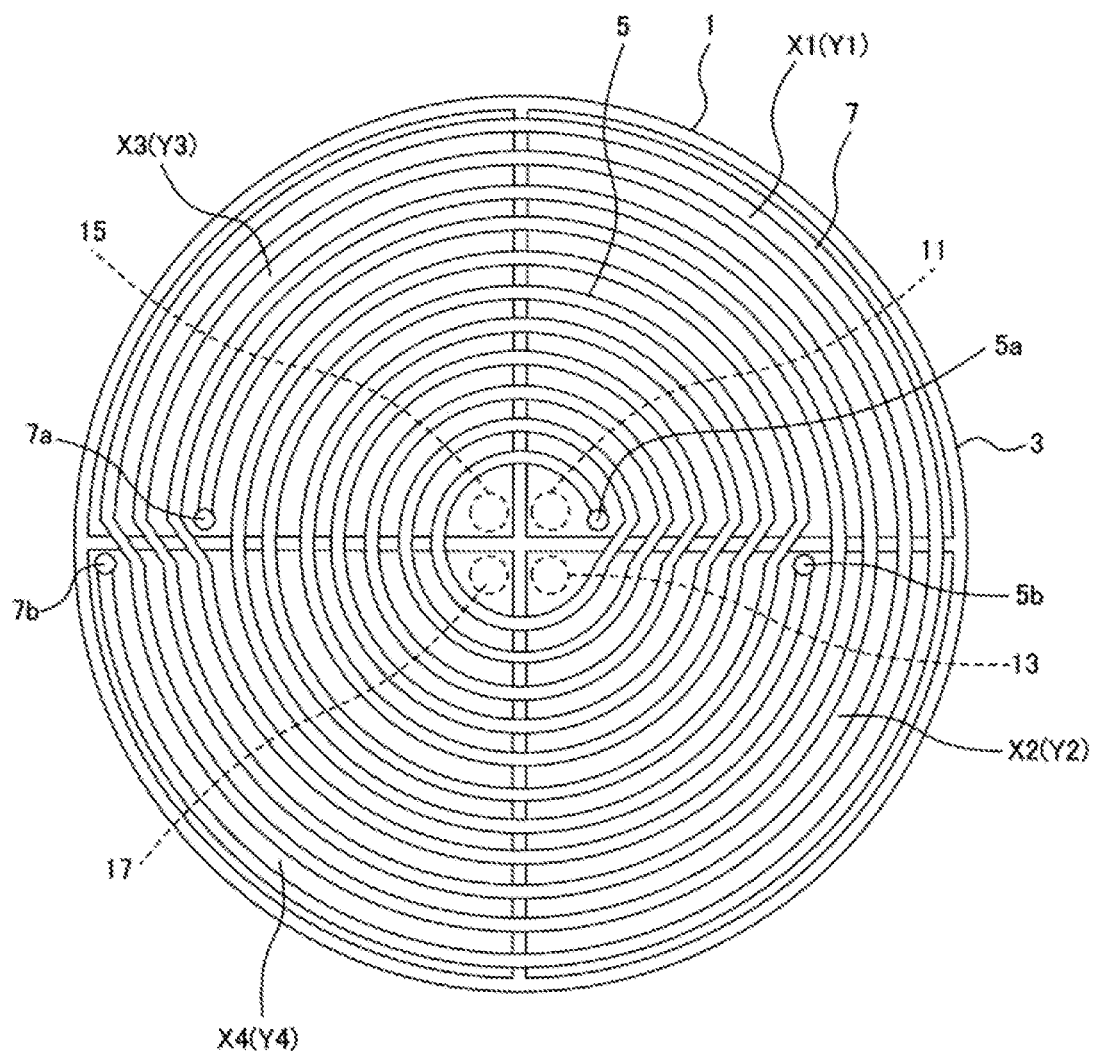
FIG. 2 Top view showing the structure of the electrostatic chuck 1.

The inner heater 5 is for heating the object of processing. The inner heater 5 is a metallization layer formed of W, Mo, Pt, or the like, and is a spiral heater located under the chucking electrode 4. As shown in FIG. 2, as viewed from above (from the thickness direction of the ceramic substrate 3), the center of the inner heater 5 coincides with the center of the ceramic substrate 3, and the inner heater 5 extends to a radially intermediate region of the ceramic substrate 3. An end portion 5a of the inner heater 5 on the inner circumferential side is located on the conductive layer X1, and an end portion 5b of the inner heater 5 on the outer circumferential side is located on the conductive layer X2.

An outer heater 7 is for heating the object of processing. The outer heater 7 is a metallization layer formed of W, Mo, Pt, or the like, and is a spiral heater located externally of the inner heater 5 on the same plane as is the inner heater 5. As shown in FIG. 2, as viewed from above, the center of the outer heater 7 coincides with the center of the ceramic substrates 3, and the outer heater 7 extends between the outermost circumference of the inner heater 5 and the outer circumference of the ceramic substrate 3. An end portion 7a of the outer heater 7 on the inner circumferential side is located on the conductive layer X3, and an end portion 7b of the outer heater 7 on the outer circumferential side is located on the conductive layer X4.

The conductive layers X1, X2, X3, and X4 are metallization layers formed of W, Mo, Pt, or the like and located under and adjacent to the inner heater 5 and the outer heater 7. Each of the conductive layers X1, X2, X3, and X4 has the shape of a quadrant, and, as viewed from above, the conductive layers X1, X2, X3, and X4 are disposed as shown in FIG. 2.

Figure 3:
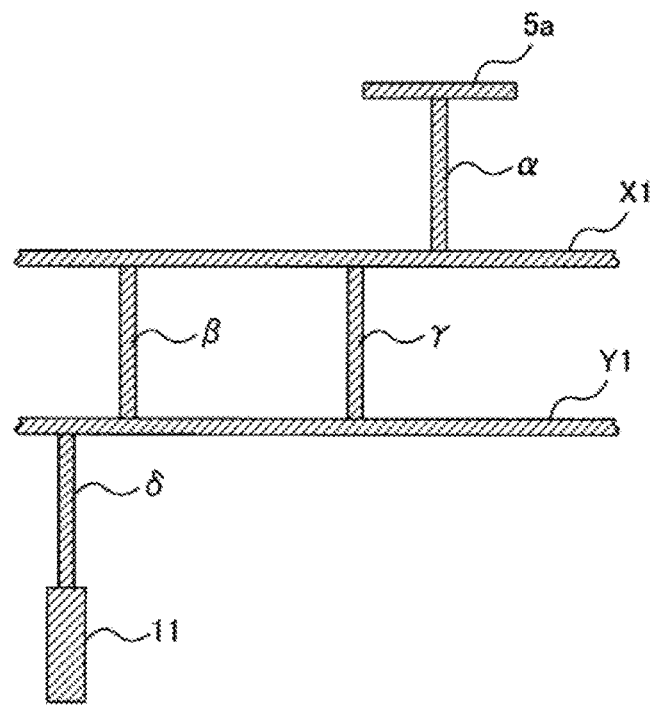
FIG. 3 Sectional view showing the structure of through vias $\alpha$, $\beta$, $\gamma$, and $\delta$ and their periphery in the electrostatic chuck 1.

As shown in FIGS. 1 and 3, the conductive layer X1 and the end portion 5a are connected by the through via α. The through via α is formed by filling a metallization material which contains W, Mo, Pt, or the like as a main component, into a through hole formed in a ceramic layer which partially constitutes the ceramic substrate 3. The same also applies to the through vias β, γ, and δ, which will be described later.

The conductive layer X2 and the end portion 5b, the conductive layer X3 and the end portion 7a, and the conductive layer X4 and the end portion 7b are also connected by the respective through vias α. Notably, hereinafter, in order to distinguish the individual through vias α, the through via α connected to the conductive layer Xi may be called the through via αi (i=1 to 4).

The conductive layers Y1, Y2, Y3, and Y4 are metallization layers formed of W, Mo, Pt, or the like and located under and adjacent to the conductive layers X1, X2, X3, and X4, respectively. The conductive layers Y1, Y2, Y3, and Y4 have the same shapes as those of the conductive layers X1, X2, X3, and X4, respectively, and are disposed as shown in FIG. 2 as viewed from above. The conductive layer Y1 is located under the conductive layer X1; the conductive layer Y2 is located under the conductive layer X2; the conductive layer Y3 is located under the conductive layer X3; and the conductive layer Y4 is located under the conductive layer X4.

As shown in FIGS. 1 and 3, the conductive layer X1 and the conductive layer Y1 are connected by the through vias β and γ.

The conductive layer X2 and the conductive layer Y2, the conductive layer X3 and the conductive layer Y3, and the conductive layer X4 and the conductive layer Y4 are also connected by the respective through vias β and γ. Notably, hereinafter, in order to distinguish the individual through vias β and γ, the through vias β and γ which connect the conductive layer Xi and the conductive layer Yi may be called the through vias βi and γi (i=1 to 4).

The terminal 9 is a rodlike terminal formed of an electrically conductive material and provided at one end of the ceramic substrate 3 on the back surface 3b side. As mentioned above, the terminal 9 is electrically connected to the chucking electrode 4 by the electricity supply path 19. The electricity supply path 19 has a well-known structure composed of conductive layers and through vias.

The terminals 11, 13, 15, and 17 are rodlike terminals formed of an electrically conductive material and provided at one end of the ceramic substrate 3 on the back surface 3b side and are provided around the terminal 9 so as to be disposed as shown in FIG. 2 as viewed from above.

As shown in FIG. 3, the terminal 11 is connected to the conductive layer Y1 by the through via δ. Similarly, the terminals 13, 15, and 17 are connected to the conductive layers Y2, Y3, and Y4 by the through vias δ, respectively. Notably, hereinafter, in order to distinguish the individual through vias δ, the through vias δ connected to the conductive layer Yi may be called the through via δi (i=1 to 4).

In the electrostatic chuck 1 having the above structure, the following current path is formed with respect to the inner heater 5: terminal 11→through via δ1→conductive layer Y1→through vias β1 and γ1→conductive layer X1→through via α1→inner heater 5→through via α2→conductive layer X2→through vias β2 and γ2 conductive layer Y2→through via δ2→terminal 13.

Also, the following current path is formed with respect to the outer heater 7: terminal 15→through via δ3→conductive layer Y3→through vias β3 and γ3→conductive layer X3→through via α3→outer heater 7→through via α4→conductive layer X4→through vias β4 and γ4→conductive layer Y4→through via δ4→terminal 17.

The current paths "terminal 11→through via δ1→conductive layer Y1→through vias β1 and γ1→conductive layer X1→through via α1→inner heater 5," "inner heater 5→through via α2→conductive layer X2→through vias β2 and γ2→conductive layer Y2→through via δ2→terminal 13," "terminal 15→through via δ3→conductive layer Y3→through vias β3 and γ3→conductive layer X3→through via α3→outer heater 7," and "outer heater 7→through via α4 →conductive layer X4→through vias β4 and γ4→conductive layer Y4→through via δ4→terminal 17" are embodiments of an electricity supply path.

Figure 4:
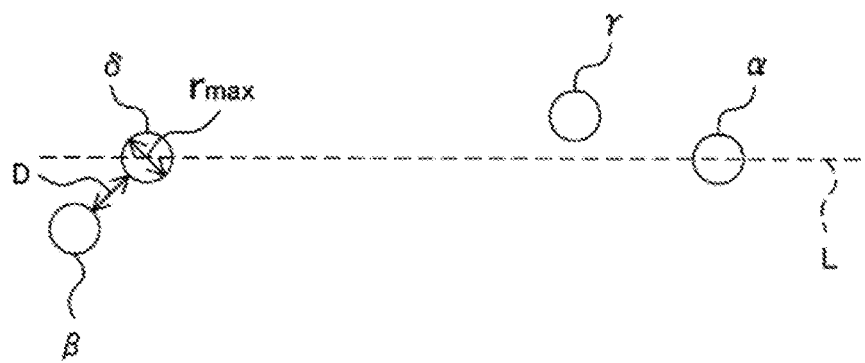
FIG. 4 Explanatory view showing the positional relation among the through vias $\alpha$, $\beta$, $\gamma$, and $\delta$ as viewed from a thickness direction of a ceramic substrate 3.

When the through vias α, β, γ, and δ which partially constitute the electricity supply paths are viewed from the thickness direction of the ceramic substrate 3, the through vias α, β, γ, and δ are in the positional relation shown in FIG. 4. FIG. 4 is a view showing projection of the through vias α, β, γ, and δ on a plane (e.g., planes of the conductive layers X1 and Y1) orthogonal to the thickness direction of the ceramic substrate 3.

The through via δ is located in the vicinity of the through via β. The expression "the through via δ is located in the vicinity of the through via β" means that, as viewed on the plane orthogonal to the thickness direction, a distance D from the through via δ to the through via β is equal to or less than 20 times a maximum diameter $r_{max}$ of the through via δ. The distance D is the shortest distance from the outermost circumference of the through via β to the outermost circumference of the through via δ.

In the case where a plurality of the through vias δ exist, it is sufficient that at least one through via δ is located in the vicinity of the through via β, and other through vias δ may be located distant from any through via β. Also, in the case where a plurality of the through vias β exist, it is sufficient that the through via δ is located in the vicinity of at least one through via β, and the through via δ may be located distant from other through vias β.

Also, as shown in FIG. 4, the through via γ is located at a position between the through via α and the through via δ. The through via γ may be located on a straight line L which connects the through via α and the through via δ, or may be located at a position offset from the straight line L.

Accordingly, when the through vias α, β, γ, and δ which partially constitute the electricity supply paths are viewed from the thickness direction of the ceramic substrate 3, the positional relation among the through vias α, β, γ, and δ meets the following conditions (1) and (2).

Condition (1): when the ceramic substrate 3 is viewed from the front surface 3a side toward the back surface 3b side, the through via δ is located at a position where the through via δ overlaps the through via β, or in the vicinity of the through via β.

Condition (2): when the ceramic substrate 3 is viewed from the front surface 3a side toward the back surface 3b side, the through via γ is located at a position between the through via α and the through via δ, or located at a position where the through via γ overlaps the through via α, or in the vicinity of the through via α.

2. Method of Manufacturing Electrostatic Chuck 1

The electrostatic chuck 1 can be manufactured by the following procedure (i) to (viii).

(i) Green sheets (ceramic layers) having a well-known composition are prepared by use of ceramic, sintering aid, organic binder, etc., as materials.

(ii) The green sheets are cut into a predetermined size.

(iii) Through holes are formed in the green sheets at positions at which through vias are to be formed later.

(iv) A metallization material which contains W, Mo, Pt, or the like as a main component is filled into the through holes to form the through vias.

(v) A metallization material which contains W, Mo, Pt, or the like as a main component is applied onto the green sheets by use of a screen printing process to form the chucking electrode 4, the inner heater 5, the outer heater 7, the conductive layers X1, X2, X3, X4, Y1, Y2, Y3, and Y4, etc.

(vi) Holes for attachment of the terminals 9, 11, 13, 15, and 17, etc. are formed in a green sheet by drilling. The outer dimeters of the green sheets are adjusted according to the shape of the electrostatic chuck 1.

(vii) The ceramic green sheets are laminated and compressed together to form the ceramic substrate 3.

(viii) The yielded laminate is debindered and fired. Then, the terminals 9, 11, 13, 15, and 17 are attached to the fired laminate to complete the electrostatic chuck 1.

3. Action and Effect of Electrostatic Chuck 1

(1A) In the electrostatic chuck 1, the positional relation between the through vias β and δ meets the condition (1). Thus, the resistance of a path from the through via δ to the through via β in each of the conductive layers Y1, Y2, Y3, and Y4 reduces. As a result, the generation of heat in the conductive layers Y1, Y2, Y3, and Y4 can be restrained.

(1B) In the electrostatic chuck 1, the electricity path includes a path passing through the through via β and a path passing through the through via γ which are in parallel with each other. Further, since the positional relation among the through vias α, γ, and δ meets the condition (2), current flows sufficiently not only in the path passing through the through via β but also in the path passing through the through via γ. As a result, current which flows in the path passing through the through via β can be restrained, whereby the generation of heat in the path can be restrained.

4. Method of Verifying Positional Relation among Through Vias α, β, γ, and δ

The positional relation among the through vias α, β, γ, and δ in the electrostatic chuck 1 can be verified as follows.

(i) First, through use of transmissive X-ray, approximate positions of the through vias α, β, γ, and δ are identified.

(ii) Next, the electrostatic chuck 1 is ground from the front surface 3*a* side. The depth of grinding in each grinding operation is sufficiently smaller than the axial lengths of the through vias α, β, γ, and δ.

(iii) Regions around the positions identified above in the step (i) on the ground surface are observed for the through vias α, β, γ, and δ.

Subsequently, the above steps (ii) and (iii) are alternately repeated to identify the precise positions of the through vias α, β, γ, and δ. Also, in second to eleventh embodiments to be described later, the positional relation among the through vias α, β, γ, and δ can be identified similarly.

Second Embodiment

1. Structure of Electrostatic Chuck 1

The structure of the electrostatic chuck 1 of the present embodiment is basically similar to that of the first embodiment. The following description centers on points of difference.

Figure 5:
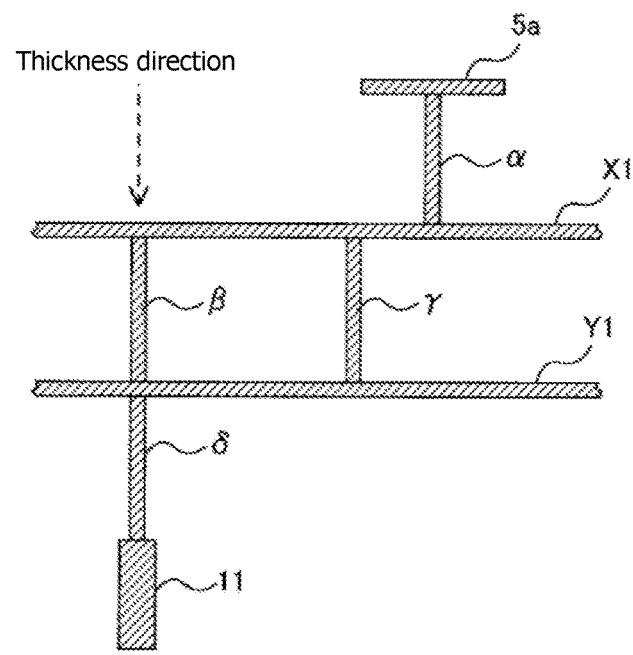
FIG. 5 Sectional view showing the structure of the through vias $\alpha$, $\beta$, $\gamma$, and $\delta$ and their periphery in the electrostatic chuck 1.

As shown in FIG. 5, when the ceramic substrate 3 is viewed from the thickness direction, the through via δ is located at a position where the through via δ overlaps the through via β. In the present embodiment also, the positional relation among the through vias α, β, γ, and δ which partially constitute the electricity supply paths meets the conditions (1) and (2).

2. Action and Effect of Electrostatic Chuck 1

The electrostatic chuck 1 of the present embodiment further yields the following effect in addition to the effects (1A) and (1B) of the first embodiment.

(2A) In the electrostatic chuck 1, when the ceramic substrate 3 is viewed from the thickness direction, the through via δ is located at a position where the through via δ overlaps the through via β. Thus, the resistance of a path from the through via δ to the through via β in each of the conductive layers Y1, Y2, Y3, and Y4 further reduces. As a result, the generation of heat in the conductive layers Y1, Y2, Y3, and Y4 can be further restrained.

Third Embodiment

1. Structure of Electrostatic Chuck 1

The structure of the electrostatic chuck 1 of the present embodiment is basically similar to that of the second embodiment. The following description centers on points of difference.

Figure 6:
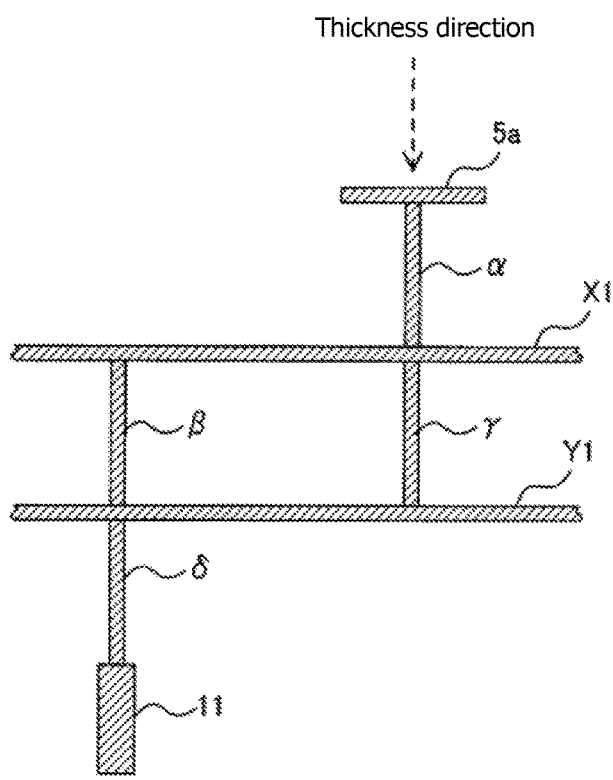
FIG. 6 Sectional view showing the structure of the through vias α, β, γ, and δ and their periphery in the electrostatic chuck 1.

As shown in FIG. 6, when the ceramic substrate 3 is viewed from the thickness direction, the through via γ is located at a position where the through via γ overlaps the through via α. In the present embodiment also, the positional relation among the through vias α, β, γ, and δ which partially constitute the electricity supply paths meets the conditions (1) and (2).

2. Action and Effect of Electrostatic Chuck 1

The electrostatic chuck 1 of the present embodiment yields effects similar to the effects (1A), (1B), and (2A) of the second embodiment.

Fourth Embodiment

1. Structure of Electrostatic Chuck 1

The structure of the electrostatic chuck 1 of the present embodiment is basically similar to that of the second embodiment. The following description centers on points of difference.

Figure 7:
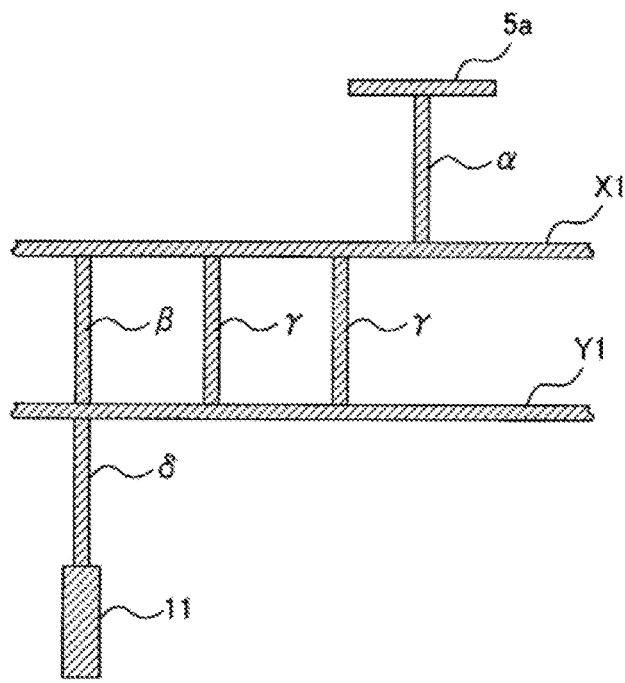
FIG. 7 Sectional view showing the structure of the through vias α, β, γ, and δ and their periphery in the electrostatic chuck 1.

As shown in FIG. 7, the electrostatic chuck 1 has a plurality of the through vias γ. The positional relation between any one of the through vias γ, and the through vias α, β, and δ meets the conditions (1) and (2).

2. Action and Effect of Electrostatic Chuck 1

The electrostatic chuck 1 of the present embodiment further yields the following effect in addition to the effects (1A), (1B), and (2A) of the second embodiment.

(4A) The electrostatic chuck 1 has a plurality of the through vias γ which meet the conditions (1) and (2). Thus, the current flowing through the electricity supply path can be dispersed further, whereby the generation of heat can be further restrained.

Fifth Embodiment

1. Structure of Electrostatic Chuck 1

The structure of the electrostatic chuck 1 of the present embodiment is basically similar to that of the second embodiment. The following description centers on points of difference.

Figure 8:
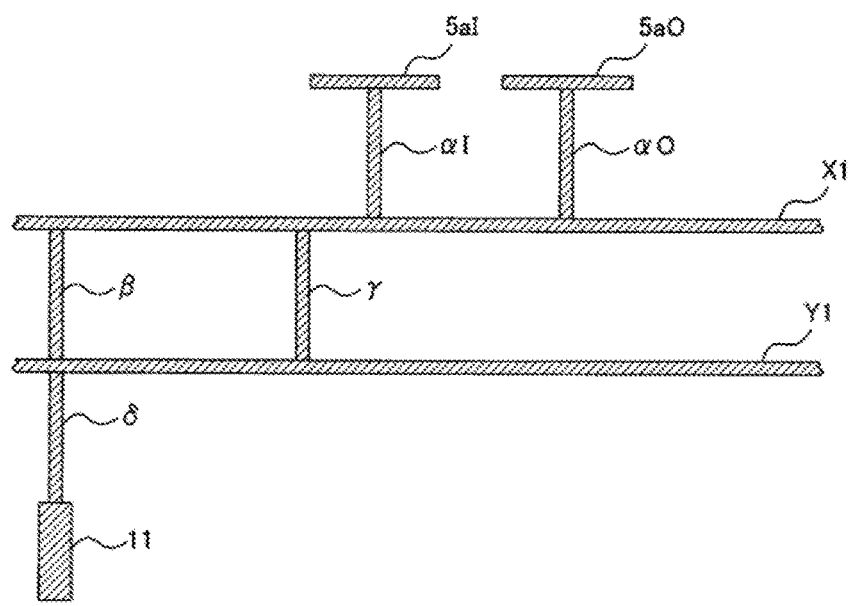
FIG. 8 Sectional view showing the structure of the through vias αI, αO, β, γ, and δ and their periphery in the electrostatic chuck 1.

The electrostatic chuck 1 has two inner heaters 5 in parallel with each other. As shown in FIG. 8, an end portion 5aI of one inner heater 5 and an end portion 5aO of the other inner heater 5 are connected to the conductive layer X1 by the respective through vias α. Hereinafter, the through via α connected to the end portion 5aI is called the through via αI, and the through via α connected to the end portion 5aO is called the through via αO.

When the ceramic substrate 3 is viewed from the thickness direction, the positional relation among the through vias αI, β, γ, and δ is similar to the positional relation among the through vias α, β, γ, and δ in the second embodiment. Also, the positional relation among the through vias αO, β, γ, and δ is similar to the positional relation among the through vias α, β, γ, and δ in the second embodiment.

Thus, a combination of the through vias αI, β, γ, and δ and a combination of the through vias αO, β, γ, and δ meet the conditions (1) and (2).

2. Action and Effect of Electrostatic Chuck 1

The electrostatic chuck 1 of the present embodiment yields effects similar to the effects (1A), (1B), and (2A) of the second embodiment.

Sixth Embodiment

1. Structure of Electrostatic Chuck 1

The structure of the electrostatic chuck 1 of the present embodiment is basically similar to that of the fifth embodiment. The following description centers on points of difference.

Figure 9:
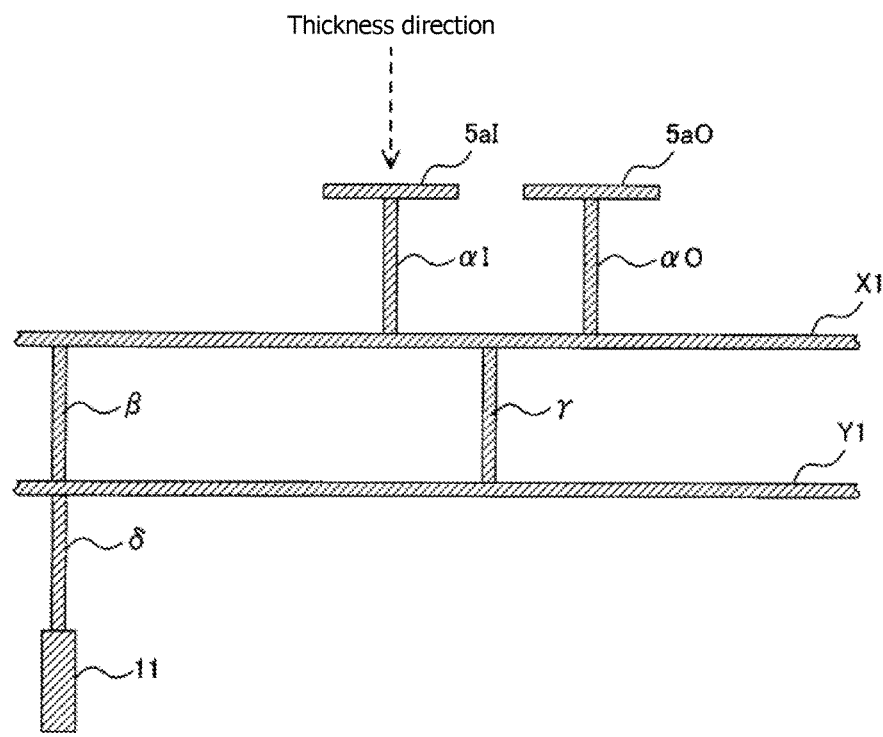
FIG. 9 Sectional view showing the structure of the through vias αI, αO, β, γ, and δ and their periphery in the electrostatic chuck 1.

As shown in FIG. 9, when the ceramic substrate 3 is viewed from the thickness direction, the through via γ is not located at a position between the through via αI and the through via δ. That is, a combination of the through vias αI, β, γ, and δ does not meet the condition (2).

Meanwhile, when the ceramic substrate 3 is viewed from the thickness direction, the positional relation among the through vias αO, β, γ, and δ is similar to the positional relation among the through vias α, β, γ, and δ in the second embodiment. Thus, a combination of the through vias αO, β, γ, and δ meets the conditions (1) and (2).

2. Action and Effect of Electrostatic Chuck 1

The electrostatic chuck 1 of the present embodiment yields effects similar to the effects (1A), (1B), and (2A) of the second embodiment.

Seventh Embodiment

1. Structure of Electrostatic Chuck 1

The structure of the electrostatic chuck 1 of the present embodiment is basically similar to that of the second embodiment. The following description centers on points of difference.

Figure 10:
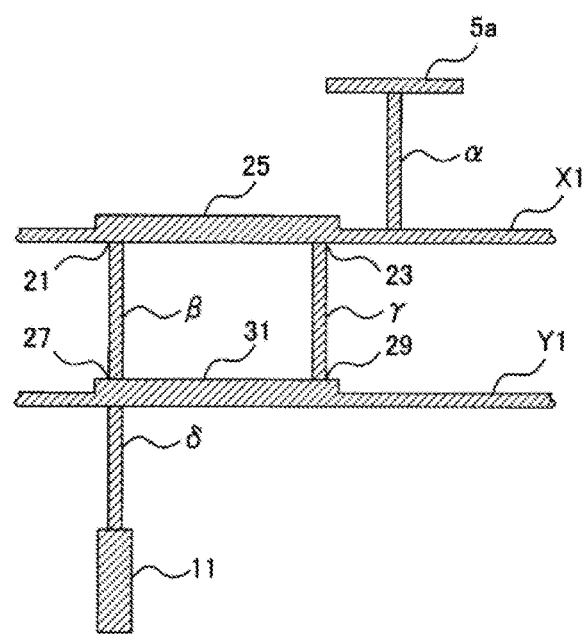
FIG. 10 Sectional view showing the structure of the through vias α, β, γ, and δ and their periphery in the electrostatic chuck 1.

As shown in FIG. 10, the conductive layer X1 has a region 25 which includes a connection 21 connected to the through via β and a connection 23 connected to the through via γ and which is greater in film thickness than its periphery. The region 25 continues from the connection 21 to the connection 23 on the conductive layer X1. That is, the region 25 is connected to the through via β and is greater in film thickness than its periphery.

Also, the conductive layer Y1 has a region 31 which includes a connection 27 connected to the through via 67 and a connection 29 connected to the through via γ and which is greater in film thickness than its periphery. The region 31 continues from the connection 27 to the connection 29 on the conductive layer Y1. That is, the region 31 is connected to the through via δ and is greater in film thickness than its periphery.

When the ceramic substrate 3 is viewed from the thickness direction, the regions 25 and 31 can have an appropriate shape; for example, a strip shape, a circular shape, an elliptic shape, a quadrangular shape, a trapezoidal shape, a triangular shape, or the like. The conductive layers X2, X3, X4, Y1, Y2, Y3, and Y4 also have a structure similar to that of the conductive layer X1.

The region 25 can be formed as follows. In formation of the ceramic substrate 3, a metallization material is applied to the upper surface of a green sheet which is to be located below the conductive layer X1, in a region corresponding to the entire region of the conductive layer X1. The metallization material is applied to the lower surface of a green sheet which is to be located above the conductive layer X1, in a region corresponding to the region 25 of the conductive layer X1. The green sheet which is to be located below the conductive layer X1, and the green sheet which is to be located above the conductive layer X1 are laminated together, thereby forming the conductive layer X1 in which the region 25 is greater in film thickness than its periphery. Also, the region 31 can be formed in the same manner.

The region 25 may be such that: the upper surface of the conductive layer X1 protrudes from its periphery as shown in FIG. 10; the lower surface of the conductive layer X1 protrudes from its periphery; or both the upper surface and the lower surface of the conductive layer X1 protrude from their peripheries. The same also applies to the region 31.

2. Action and Effect of Electrostatic Chuck 1

The electrostatic chuck 1 of the present embodiment further yields the following effects in addition to the effects (1A), (1B), and (2A) of the second embodiment.

(7A) The conductive layer X1 has the region 25 connected to the through via β and greater in film thickness than its periphery. Thus, the generation of heat by current introduced from the through via β to the conductive layer X1 can be further restrained.

Also, the conductive layer Y1 has the region 31 connected to the through via δ and greater in film thickness than its periphery. Thus, the generation of heat by current introduced from the through via δ to the conductive layer Y1 can be further restrained.

(7B) The region 25 continues up to the connection 23 with the through via γ. Thus, the effect of restraining the generation of heat in the conductive layer X1 is of particular note. Also, the region 31 continues up to the connection 29 with the through via γ. Thus, the effect of restraining the generation of heat in the conductive layer Y1 is of particular note.

Eighth Embodiment

1. Structure of Electrostatic Chuck 1

The structure of the electrostatic chuck 1 of the present embodiment is basically similar to that of the seventh embodiment. The following description centers on points of difference.

Figure 11:
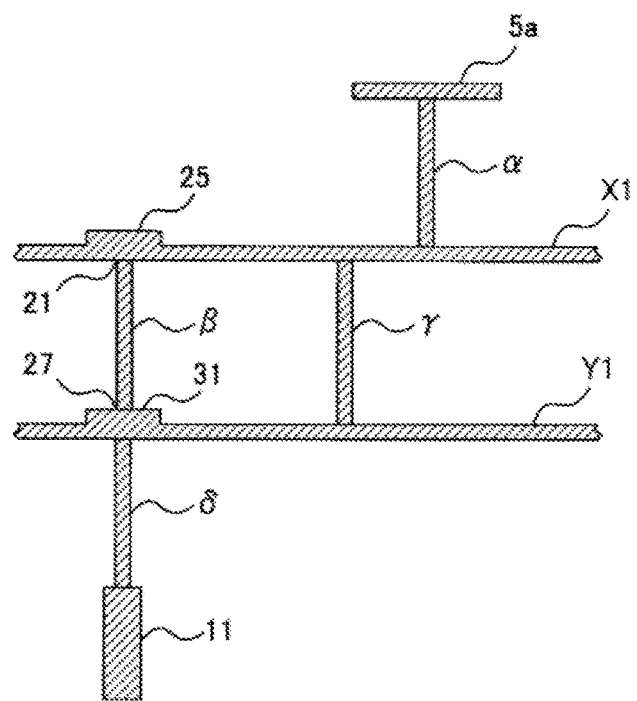
FIG. 11 Sectional view showing the structure of the through vias α, β, γ, and δ and their periphery in the electrostatic chuck 1.

As shown in FIG. 11, a region 25 of the conductive layer X1 includes the connection 21 with the through via β, but does not extend up to the through via γ. Also, a region 31 of the conductive layer Y1 includes the connection 27 with the through via δ, but does not extend up to the through via γ. The conductive layers X2, X3, X4, Y1, Y2, Y3, and Y4 also have a structure similar to that of the conductive layer X1.

2. Action and Effect of Electrostatic Chuck 1

The electrostatic chuck 1 of the present embodiment yields effects similar to the effects (1A), (1B), (2A), and (7A) of the seventh embodiment.

Ninth Embodiment

1. Structure of Electrostatic Chuck 1

The structure of the electrostatic chuck 1 of the present embodiment is basically similar to that of the first embodiment. The following description centers on points of difference.

Figure 12:
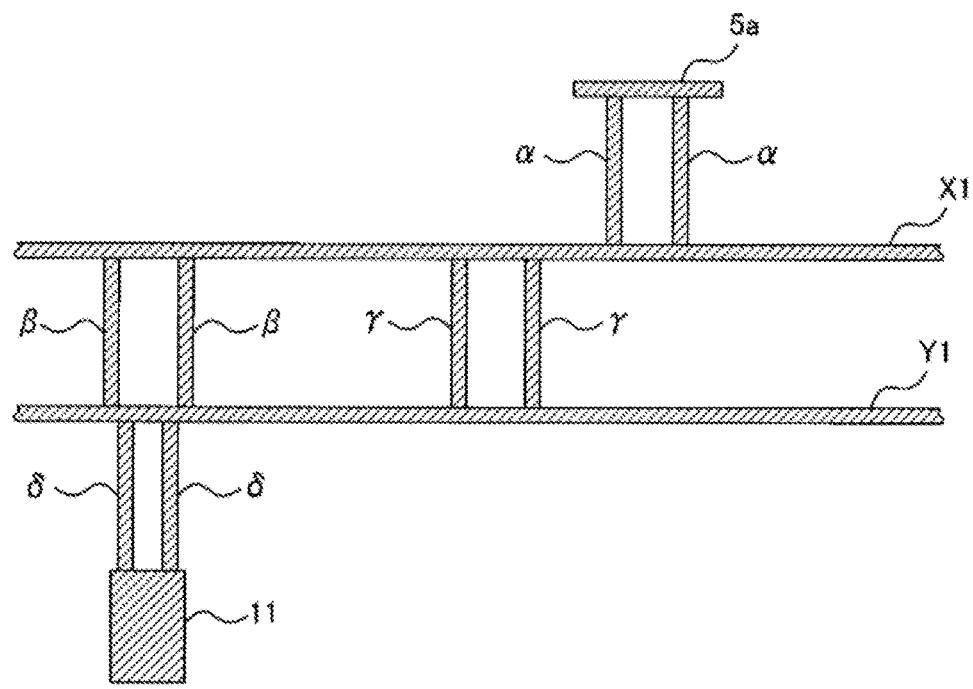
FIG. 12 Sectional view showing the structure of the through vias α, β, γ, and δ and their periphery in the electrostatic chuck 1.

As shown in FIG. 12, there exist a plurality of the through vias α which connect the end portion 5a and the conductive layer X1. Also, there exist a plurality of the through vias β and a plurality of the through vias γ which connect the conductive layer X1 and the conductive layer Y1. Further, there exist a plurality of the through vias δ which connect the conductive layer Y1 and the terminal 11.

Figure 13:
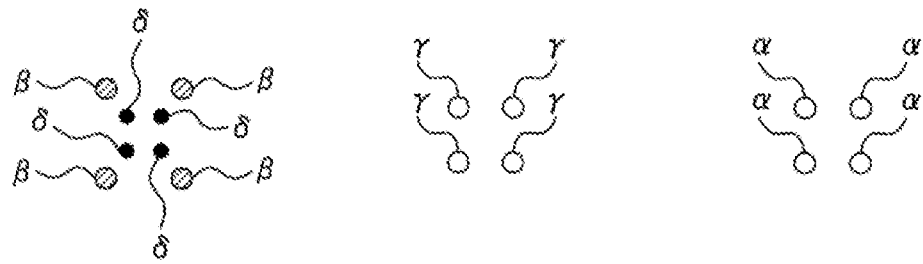
FIG. 13 Explanatory view showing the positional relation among the through vias α, β, γ, and δ as viewed from the thickness direction of the ceramic substrate 3.

When the through vias α, β, γ, and δ are viewed from the thickness direction of the ceramic substrate 3, the positional relation among the through vias α, β, γ, and δ is as shown in FIG. 13.

At least one of the through vias δ is located in the vicinity of some or all of the through vias β. Thus, the through vias β and δ meet the condition (1). Also, at least one combination of the through vias α, γ, and δ selected from pluralities of through vias α, γ, and δ meets the condition (2).

2. Action and Effect of Electrostatic Chuck 1

The electrostatic chuck 1 of the present embodiment further yields the following effect in addition to the effects (1A) and (1B) of the first embodiment.

(9A) Since the electrostatic chuck 1 has pluralities of the through vias α, β, γ, and δ, the current path can be branched further, whereby the generation of heat in the conductive layers X1 and Y1 can be further restrained.

Tenth Embodiment

1. Structure of Electrostatic Chuck 1

The structure of the electrostatic chuck 1 of the present embodiment is basically similar to that of the first embodiment. The following description centers on points of difference.

Figure 14:
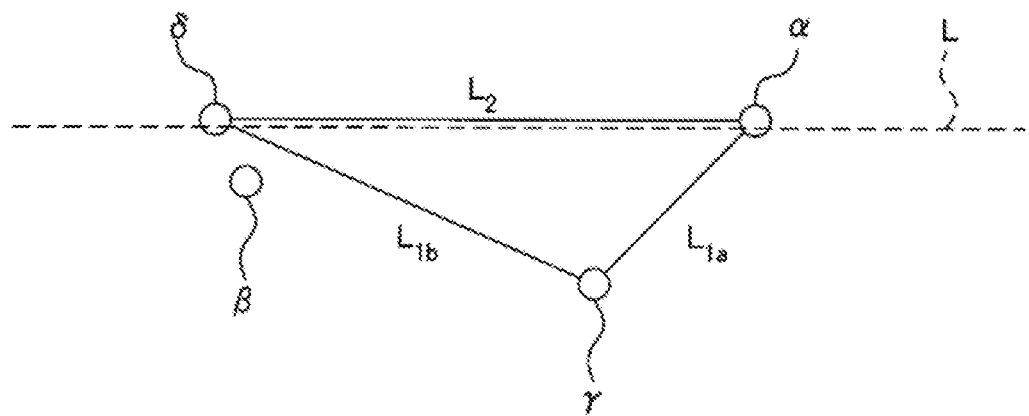
FIG. 14 Explanatory view showing the positional relation among the through vias α, β, γ, and δ as viewed from the thickness direction of the ceramic substrate 3.

When the through vias α, β, γ, and δ are viewed from the thickness direction of the ceramic substrate 3, the positional relation among the through vias α, β, γ, and δ is as shown in FIG. 14. FIG. 14 is a view showing projection of the through vias α, β, γ, and δ on a plane (e.g., planes of the conductive layers X1 and Y1) orthogonal to the thickness direction of the ceramic substrate 3.

In FIG. 14, the through via γ is not located on a straight line L passing through the through via α and the through via δ, but the position of the through via γ in the direction of the straight line L is located between the through via α and the through via δ.

Also, a length L1 of a path extending from the through via α to the through via δ by way of the through via γ (the sum of a length L1a of a line segment connecting the through via α and the through via γ and a length L1b of a line segment connecting the through via γ and the through via δ) is equal to or less than 1.3 times a length L2 of a straight path extending directly from the through via α to the through via δ. The length L1 is preferably equal to or less than 1.2 times the length L2, more preferably equal to or less than 1.1 times the length L2. The positional relation between the through vias β and δ is similar to that of the first embodiment.

Thus, when the through vias α, β, γ, and δ are viewed from the thickness direction of the ceramic substrate 3, the positional relation among the through vias α, β, γ, and δ meets the conditions (1) and (2).

2. Action and Effect of Electrostatic Chuck 1

The electrostatic chuck 1 of the present embodiment yields effects similar to the effects (1A) and (1B) of the first embodiment.

Eleventh Embodiment

1. Structure of Electrostatic Chuck 1

The structure of the electrostatic chuck 1 of the present embodiment is basically similar to that of the first embodiment. The following description centers on points of difference.

Figure 15:
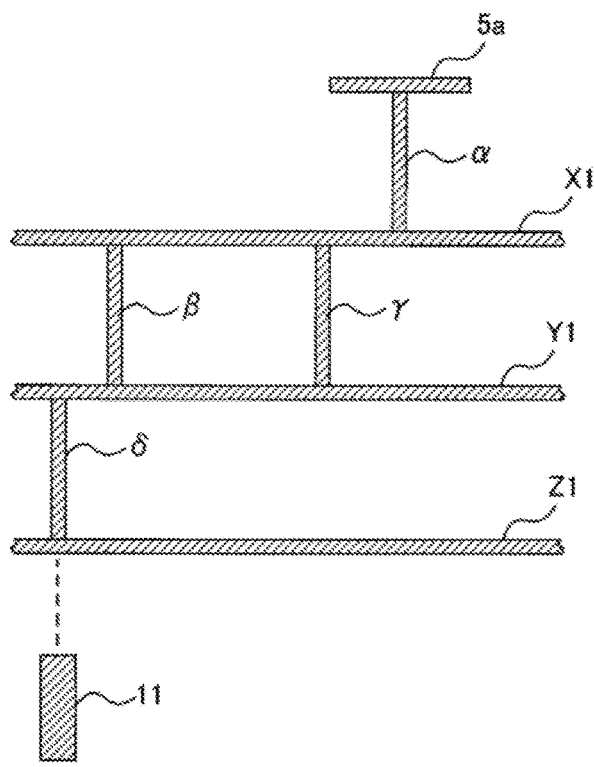
FIG. 15 Sectional view showing the structure of the through vias α, β, γ, and δ and their periphery in the electrostatic chuck 1.

As shown in FIG. 15, the through via δ connects the conductive layer Y1 and the conductive layer Z1 adjacent to the conductive layer Y1 on the terminal 11 side. Similarly, the through via δ connects the conductive layers Y2, Y3, and Y4 to the conductive layers Z2, Z3, and Z4, respectively.

2. Action and Effect of Electrostatic Chuck 1

The electrostatic chuck 1 of the present embodiment yields effects similar to the effects (1A) and (1B) of the first embodiment.

The present invention is not limited to the above embodiments, but may be embodied in various other forms without departing from the gist of the invention.

(1) In the first to eleventh embodiments, the conductive layers X1, X2, X3, and X4 may not be adjacent to the inner heater 5 and the outer heater 7. For example, another conductive layer, or a conductive pad (to be described layer) which partially constitutes the through via α may exist between the conductive layers X1, X2, X3, and X4 and the inner and outer heaters 5 and 7.

In the first to eleventh embodiments, the conductive layers Y1, Y2, Y3, and Y4 may not be adjacent to the conductive layers X1, X2, X3, and X4, respectively. For example, another conductive layer, or conductive pads which partially constitute the through via β and γ may exist between the conductive layers Y1, Y2, Y3, and Y4 and the conductive layers X1, X2, X3, and X4.

In the first to tenth embodiments, the conductive layers Y1, Y2, Y3, and Y4 may not be adjacent to the terminals 11, 13, 15, and 17. For example, another conductive layer, or a conductive pad which partially constitutes the through via δ may exist between the conductive layers Y1, Y2, Y3, and Y4 and the terminals 11, 13, 15, and 17.

In the eleventh embodiment, the conductive layers Y1, Y2, Y3, and Y4 may not be adjacent to the conductive layers Z1, Z2, Z3, and Z4, respectively. For example, another conductive layer, or a conductive pad which partially constitutes the through via δ may exist between the conductive layers Y1, Y2, Y3, and Y4 and the conductive layers Z1, Z2, Z3, and Z4, respectively.

Figure 16:
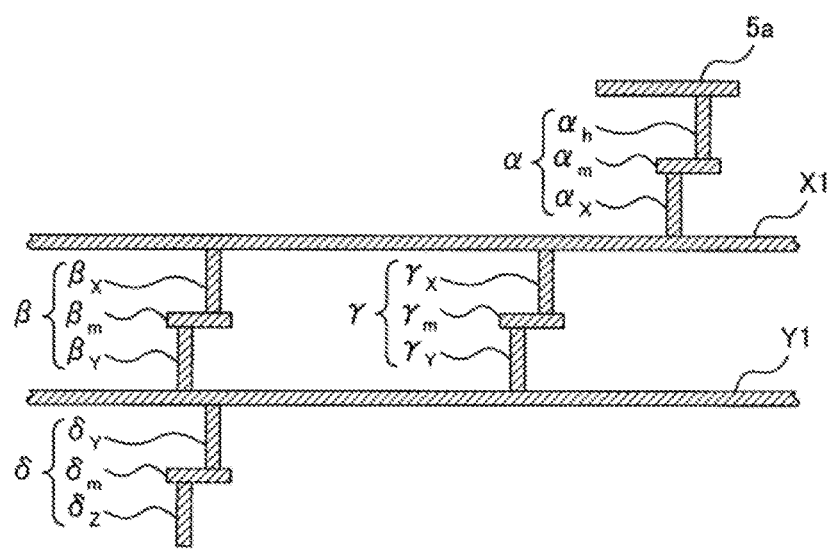
FIG. 16 Sectional view showing another form of the through vias α, β, γ, and δ.

(2) In the first through eleventh embodiments, as shown in FIG. 16, the through via α may be composed of a through via $α_h$, a conductive pad $α_m$, and a through via $α_X$ connected in series. The through via $α_h$ connects the heater and the conductive pad $α_m$. The conductive pad $α_m$ is a kind of conductive layer and can be formed as are the conductive layers X and Y. The through via $α_X$ connects the conductive pad $α_m$ and the conductive layer X. The through via $α_h$ and the through via $α_X$ are offset from each other in a direction orthogonal to the thickness direction.

Similarly, the through via β may be composed of a through via $β_X$, a conductive pad $β_m$, and a through via $β_Y$ connected in series. The through via $β_X$ connects the conductive layer X and the conductive pad $β_m$. The conductive pad $β_m$ is similar to the conductive pad $α_m$. The through via $β_Y$ connects the conductive pad $β_m$ and the conductive layer Y.

Similarly, the through via γ may be composed of a through via $γ_X$, a conductive pad $γ_m$, and a through via $γ_Y$ connected in series. The through via $γ_X$ connects the conductive layer X and the conductive pad $γ_m$. The conductive pad $γ_m$ is similar to the conductive pad $α_m$. The through via $γ_Y$ connects the conductive pad $γ_m$ and the conductive layer Y.

Similarly, the through via δ may be composed of a through via $δ_Y$, a conductive pad $δ_m$, and a through via $δ_Z$ connected in series. The through via $δ_Y$ connects the conductive layer Y and the conductive pad $δ_m$. The conductive pad $δ_m$ is similar to the conductive pad $α_m$. The through via $δ_Z$ connects the conductive pad $δ_m$ and the conductive layer Z or a terminal.

In the case of the above through vias β and δ, the expression "the through via δ is located in the vicinity of the through via β" means that the through via $β_Y$ and the through via $δ_Y$ are in the positional relation of vicinity mentioned above.

(3) In the first to eleventh embodiments, when the ceramic substrate 3 is viewed from the thickness direction, the through via γ may be located in the vicinity of the through via α. The term "vicinity" has meaning similar to that of vicinity appearing in the positional relation between the through vias β and δ. Specifically, the expression "the through via γ is located in the vicinity of the through via α" means that the distance from the through via γ to the through via α is equal to or less than 20 times the maximum diameter of the through via γ. The distance from the through via γ to the through via α is the shortest distance from the outermost circumference of the through via γ to the outermost circumference of the through via α.

(4) Portions or all of the structures of the first to eleventh embodiments may be combined as appropriate.

(5) A ceramic heater having a structure basically similar to any one of the structures of the first to eleventh embodiments may be manufactured. The ceramic heater can be such that the chucking electrode 4, the terminal 9, and the electricity supply path 19 are removed from the electrostatic chuck 1 of any one of the first to eleventh embodiments.

(6) The electrostatic chuck 1 may have a single heater instead of the inner heater 5 and the outer heater 7. Alternatively, the electrostatic chuck 1 may have three or more heaters.

DESCRIPTION OF REFERENCE NUMERALS

1: electrostatic chuck; 3: ceramic substrate; 3a: front surface; 3b: back surface; 4: chucking electrode; 5: inner heater; 5a, 5aI, 5aO, 5b: end portion; 7: outer heater; 7a, 7b: end portion; 9, 11, 13, 15, 17: terminal; 19: electricity supply path; 21, 23, 27, 29: connection; 25, 31: region; L: straight line; X1, X2, X3, X4, Y1, Y2, Y3, Y4: conductive layer

What is claimed is:

1. A multilayer heating body comprising:
    a ceramic substrate having a front surface and a back surface and adapted to support an object of processing on the front surface;
    an electrode provided in the ceramic substrate and adapted to chuck the object of processing;
    a heater provided in the ceramic substrate and adapted to heat the object of processing;
    a terminal attached to one end of the ceramic substrate on the back surface side; and
    an electricity supply path for supplying electricity from the terminal to the heater;
    wherein the electricity supply path is formed by combining a plurality of conductive layers and a plurality of through vias provided in the ceramic substrate;
    the plurality of through vias include:
        four or more through via $\alpha$ which connect the heater and a conductive layer X, which is one of the conductive layers;
        four or more through via $\beta$ which directly connect a conductive layer Y, which is one of the conductive layers, and the conductive layer X;
        four or more through via $\gamma$ which directly connect the conductive layer Y and the conductive layer X such that the four or more through via $\beta$ are connected in parallel with the four or more through via $\gamma$; and
        four or more through via $\delta$ which connect a conductive layer Z, which is one of the conductive layers, or the terminal and the conductive layer Y; and
    there exists at least one combination of the four or more through via $\alpha$, the four or more through via $\beta$, the four or more through via $\gamma$, and the four or more through via $\delta$ which meets conditions (1) and (2) specified as follows:
    condition (1): when the ceramic substrate is viewed from the front surface side toward the back surface side, each through via $\delta$ is located at a position where the through via $\delta$ overlaps one of the four or more through via $\beta$, or in the vicinity of one of the four or more through via $\beta$; and
    condition (2): when the ceramic substrate is viewed from the front surface side toward the back surface side, each through via $\gamma$ is located at a position between one of the four or more through via $\alpha$ and one of the four or more through via $\delta$.

2. A multilayer heating body according to claim 1, wherein the vicinity of each through via $\delta$ is a range in which a distance from the through via $\delta$ to the one of the four or more through via $\beta$ is equal to or less than 20 times a maximum diameter of the through via $\delta$.

3. A multilayer heating body according to claim 1, wherein when the four or more through via $\alpha$, the four or more through via $\gamma$, and the four or more through via $\delta$ are projected on a plane orthogonal to a direction directed from the front surface side toward the back surface side, a length L1 of a path extending from one of the four or more through via $\alpha$ to one of the four or more through via $\delta$ by way of one of the four or more through via $\gamma$ is equal to or less than 1.3 times a length L2 of a path extending directly from the one of the four or more through via $\alpha$ to the one of the four or more through via $\delta$.

4. A multilayer heating body according to claim 1, wherein the conductive layer X has a region greater in film thickness than its periphery and connected to the four or more through via $\beta$.

5. A multilayer heating body according to claim 1, wherein the conductive layer Y has a region greater in film thickness than its periphery and connected to the four or more through via $\delta$.

6. A multilayer heating body according to claim 1, wherein a distance from any of the four or more through via $\beta$ to any of the four or more through via $\gamma$ is longer than (1) a distance between any two of the four or more through via $\beta$, and (2) a distance between any two of the four or more through via $\gamma$.

* * * * *